United States Patent [19]

Bennett

[11] 4,414,667

[45] Nov. 8, 1983

[54] FORWARD ERROR CORRECTING APPARATUS

[75] Inventor: James F. Bennett, Sudbury, Mass.

[73] Assignee: GTE Products Corporation, Stamford, Conn.

[21] Appl. No.: 325,606

[22] Filed: Nov. 27, 1981

[51] Int. Cl.³ .............................................. G06F 11/10
[52] U.S. Cl. ......................................... 371/37; 371/39
[58] Field of Search ............................. 371/37, 39, 40

[56] References Cited

U.S. PATENT DOCUMENTS 3,818,442 6/1974 Solomon ............................... 371/37

OTHER PUBLICATIONS

Peterson et al., Error-Correcting Codes, 2nd Edition, The MIT Press, Cambridge, Mass., 1972, pp. 230-240.

Primary Examiner—Charles E. Atkinson
Attorney, Agent, or Firm—Peter Xiarhos; Fred Fisher

[57] ABSTRACT

A forward error correcting apparatus employing the Kasami algorithm for trapping errors in a half-rate Golay codeword. The Golay code is defined as an (n, k, t) or (23, 12, 3) polynomial code in which each codeword is n=23 bits long, contains k=12 data bits and (n−k)=11 redundant check bits, and corrects up to a maximum of t=3 errors.

The forward error correcting apparatus includes an input data register circuit arranged to receive, store and shift therealong the data bits of the Golay codeword, and a Golay shift register circuit arranged to receive, store, shift and recirculate therein the data and check bits of the Golay codeword. The codeword shifted and recirculated within the Golay shift register circuit is divided by a generator polynomial g(x) expressed by $x^{11}+x^{10}+x^6+x^5+x^4+x^2+1$ to derive a syndrome word which is examined in a Kasami error trap circuit in accordance with the Kasami algorithm to detect one of three possible error situations. Should any one of the three possible error situations exist, the erroneous bits in the codeword are corrected.

13 Claims, 27 Drawing Figures

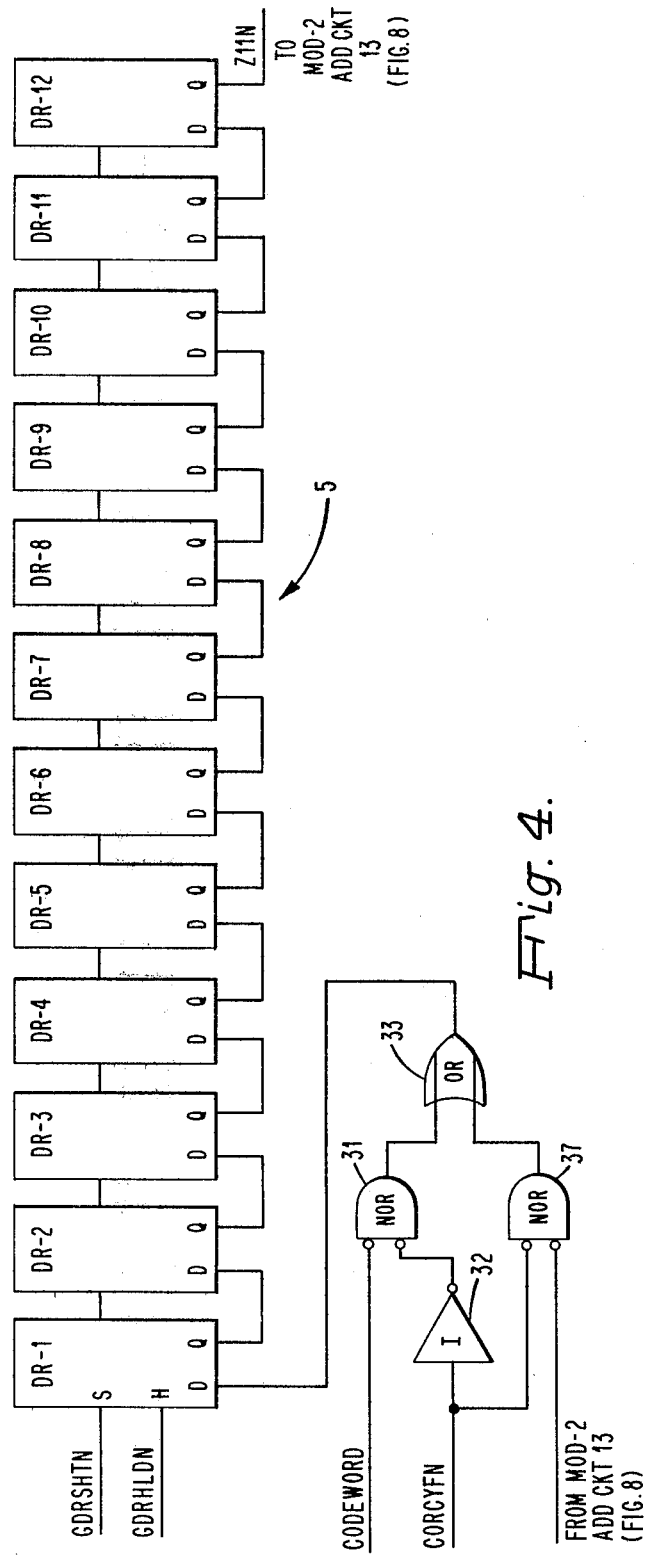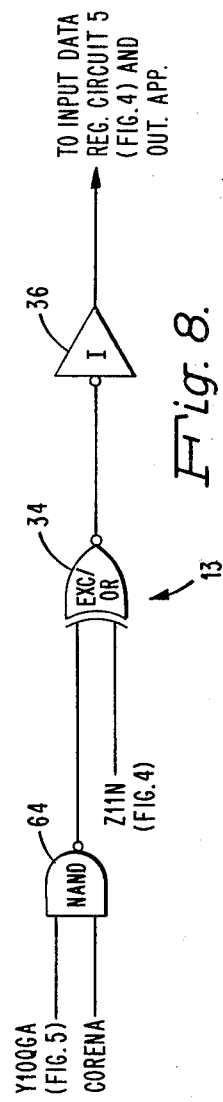

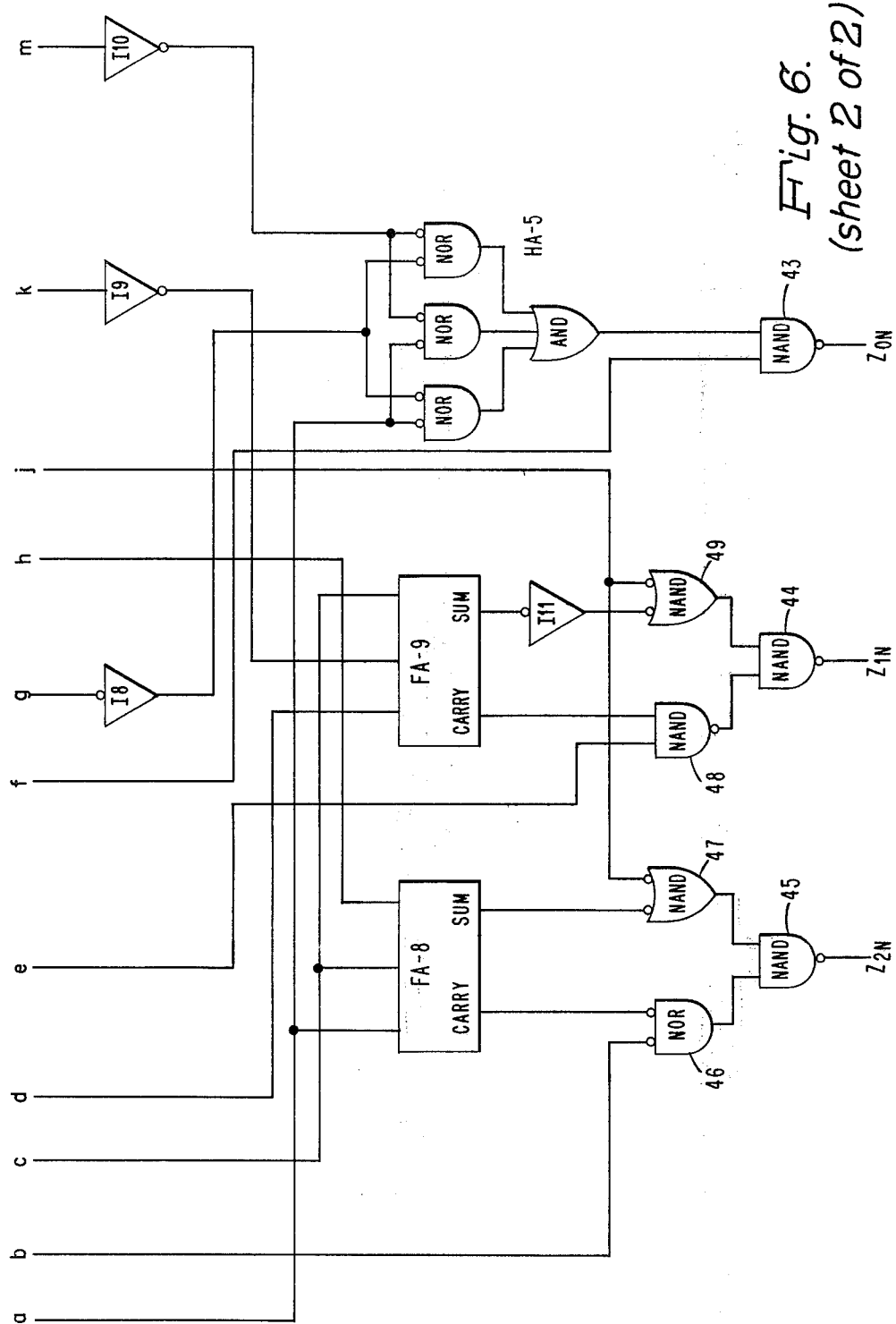
Fig. 6. (sheet 2 of 2)

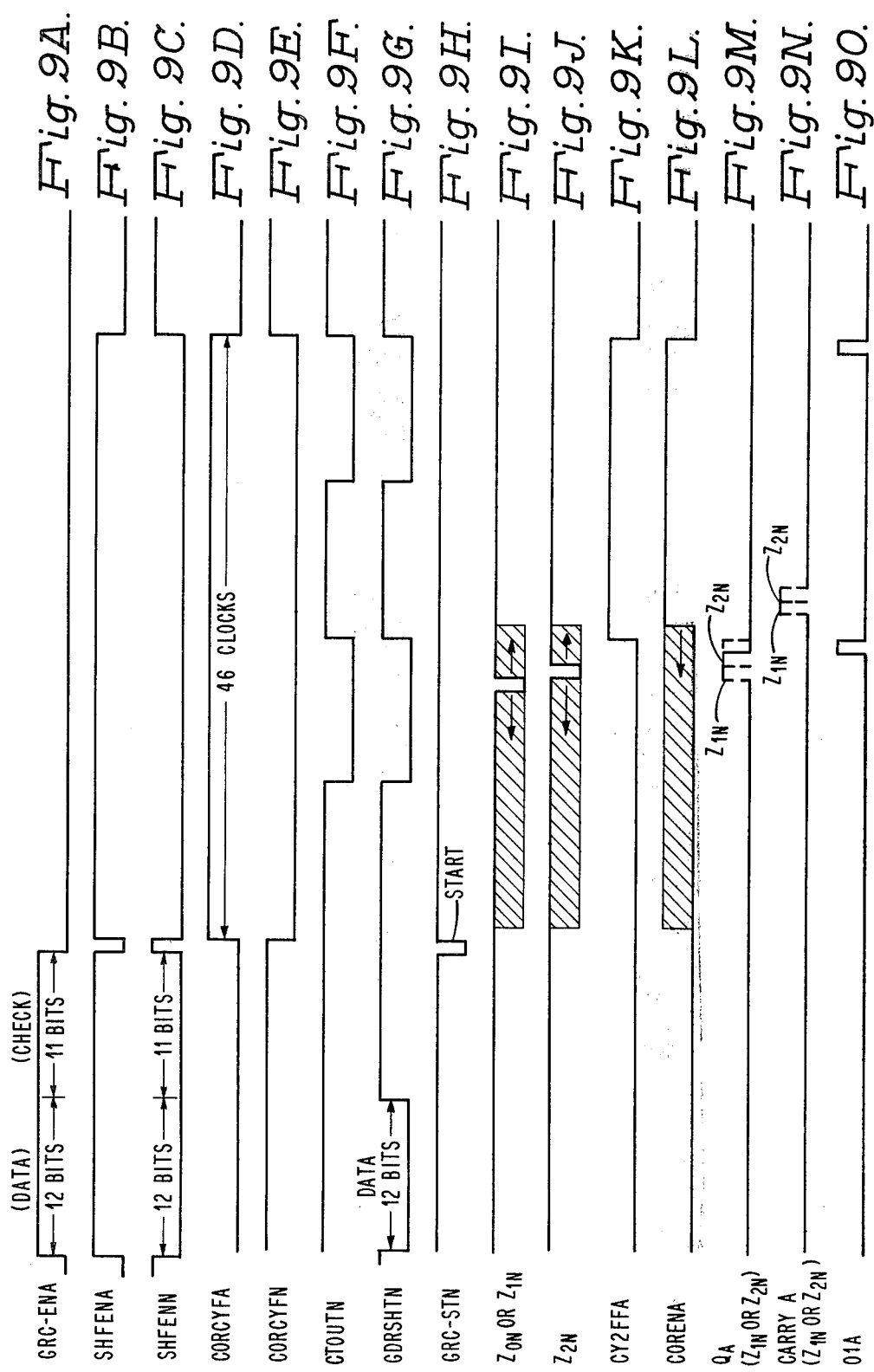

FORWARD ERROR CORRECTING APPARATUS

The invention herein described was made in the course of a contract with the Department of the Army.

FIELD OF THE INVENTION

The present invention relates to a forward error correcting apparatus and, more particularly, to a forward error correcting apparatus employing the Kasami algorithm for trapping errors in a half-rate Golay codeword.

BACKGROUND OF THE INVENTION

Both Golay coding and the utilization in connection therewith of the Kasami algorithm for error trapping purposes are well known and understood by those skilled in the art. The Golay code is a specific code defined as an (n, k, t) or (23, 12, 3) polynomial code in which each codeword is $n=23$ bits long, contains $k=12$ data or information bits, and corrects up to $t=3$ errors. The codeword also includes $(n-k)=11$ redundant check bits. The Golay code is a perfect code in that each codeword differs from every other codeword by exactly seven bits, which difference represents the so-called Hamming distance. The perfect nature of the Golay code is advantageous in that more errors can be corrected in a Golay codeword than in any other polynomial code of the same bit length. As in the case for all polynomial codes, encoding is relatively easy and straightforward. In general, a polynomial code is defined in terms of a generator polynomial $g(x)$ which, for the Golay code, can be expressed in one well known form by $g(x) = x^{11} + x^{10} + x^6 + x^5 + x^4 + x^2 + 1$. The $(n-k)=11$ redundancy check bits that must be appended to the $n=12$ information or data bits are determined by multiplying the data bits by $x^{(n-k)}$ *and dividing the result by the generator polynomial g(x).*

A properly generated and transmitted Golay codeword, if received in an error-free fashion, is an exact multiple of the generator polynomial $g(x)$, that is, the codeword when divided by $g(x)$ yields a remainder, or so-called "syndrome" word, of zero. If errors are introduced into a Golay codeword during transmission, the resulting syndrome word is other than zero, and error correction is achieved by adding a polynomial number, in a modulo-2 operation, to the codeword to make the codeword exactly divisible by $g(x)$. The Golay code is a cyclic code in that any Golay codeword can be rotated or shifted left or right any number of bits and the result will be another valid Golay codeword exactly divisible by $g(x)$. The Golay codeword is referred to as a halfrate Golay code because nearly twice as many bits are now required to transmit the same information.

Errors in a Golay codeword as discussed above can be "trapped" by the aforementioned Kasami algorithm. The Kasami error trapping algorithm tests a Golay code-word to detect one of three possible different error patterns and, depending on which error pattern is detected, alters the codeword to correct for the presence of the errors. Up to three errors, that is, three incorrect bits in a Golay codeword, can be corrected by the Kasami error trapping algorithm. The Kasami algorithm is described in detail in an article entitled "A Decoding Procedure for Multiple-Error-Correcting Cyclic Codes", by Tadao Kasami, IEEE Transactions on Information Theory, April, 1964, pp. 134-138.

Heretofore, it has been proposed to implement the Kasami error trapping algorithm as described briefly hereinabove by the use of a look-up table, for example, in PROM (programmable read only memory), which is addressed by the syndrome word and the result employed to correct a Golay codeword in software. Such a lookup table, however, requires 2047 words of 12 bits each, or 24 kilobits, and implementation of the table alone requires twelve 512×4 bit PROMS. This solution therefore, although having the advantage of very fast correction speed, is costly from a hardware standpoint.

SUMMARY OF THE INVENTION

In accordance with the present invention, a forward error correcting apparatus is provided employing the Kasami algorithm for detecting and correcting errors in a half-rate Golay codeword. The Golay codeword to which the Kasami algorithm is applicable comprises a plurality of data bits and a plurality of check bits arranged in serial succession.

The forward error correcting apparatus in accordance with the invention includes an input data register circuit means and a Golay register circuit means. The input data register circuit mean is utilized to receive in succession and store therewithin the data bits of the Golay codeword, and the Golay register circuit means is utilized to receive in succession, store, and recirculate therewithin the data and check bits of the Golay codeword. A timer means coupled to the input data register circuit means and to the Golay register circuit means operates to cause the data bits received by the input data register circuit mean to be shifted therewithin and to cause the data and check bits received by the Golay register circuit means to be shifted and recirculated therewithin. The timer means further operates following the receipt, storage and shifting within the input data register circuit means and the Golay register circuit means of the bits of the Golay codeword to produce an error detection and correction signal of a predetermined time period during which detection and correction of an erroneous Golay codeword is to take place.

The Golay register circuit means further includes a divider means operative as the bits of the Golay codeword are shifted and recirculated within the Golay register circuit means to divide the codeword by a predetermined generator polynomial thereby to derive a recirculating syndrome word comprising a plurality of bits. A Kasami error trap circuit means coupled to the Golay register circuit means operates during recirculation of the syndrome word in the Golay register circuit means and during the time period of the error detection and correction signal produced by the timer means to examine the syndrome word to detect one of three possible Kasami algorithm error patterns representing the existence of errors in the associated codeword. In response to detecting any one of the error patterns, the Kasami error trap circuit means operates to produce a corresponding error signal.

The forward error correcting error apparatus of the invention further includes a modulo-2 add means and a correction timer means. The modulo-2 add means is coupled to the input data register circuit means and to the Golay register circuit means and is utilized for performing modulo-2 addition operation on the contents of the input data register circuit means and the Golay register circuit means as determined and controlled by the correction timer means. The correction timer means is coupled to the Kasami error trap circuit means and to the modulo-2 add means and is arranged to receive the error signal produced by the Kasami error trap means. The correction timer means operates if the error signal corresponds to a first one of the Kasami algorithm error patterns to cause the modulo-2 add means to modulo-2 add the contents of the input data register circuit means and the Golay register circuit means and to apply the result to the input data register circuit means. The correction timer means further operates if the aforesaid error signal corresponds to a second or third one of the Kasami algorithm error patterns to alter the contents of the Golay register circuit means at a first or second time, respectively, and to cause the module-2 add means to modulo-2 add the contents of the input data register circuit means and the altered contents of the Golay register circuit means and to apply the result to the input data register circuit means. The timer means operates after any one of the aforesaid modulo-2 addition operations to cause the codeword bits in the input data register circuit means and the Golay register circuit means to be shifted until the termination of the error detection and correction signal produced by the timer means.

BRIEF DESCRIPTION OF THE DRAWING

In the drawing:

FIG. 4 is a schematic diagram of an input data register circuit employed in the forward error correcting apparatus of FIG. 1;

FIG. 8 is a schematic diagram of a modulo-2 add circuit employed in the forward error correcting apparatus of FIG. 1;

FIGS. 9A-9O are waveforms of signals taken at various points in the circuits of the forward error correcting apparatus in accordance with the invention.

DETAILED DESCRIPTION OF THE INVENTION

Figure 1:
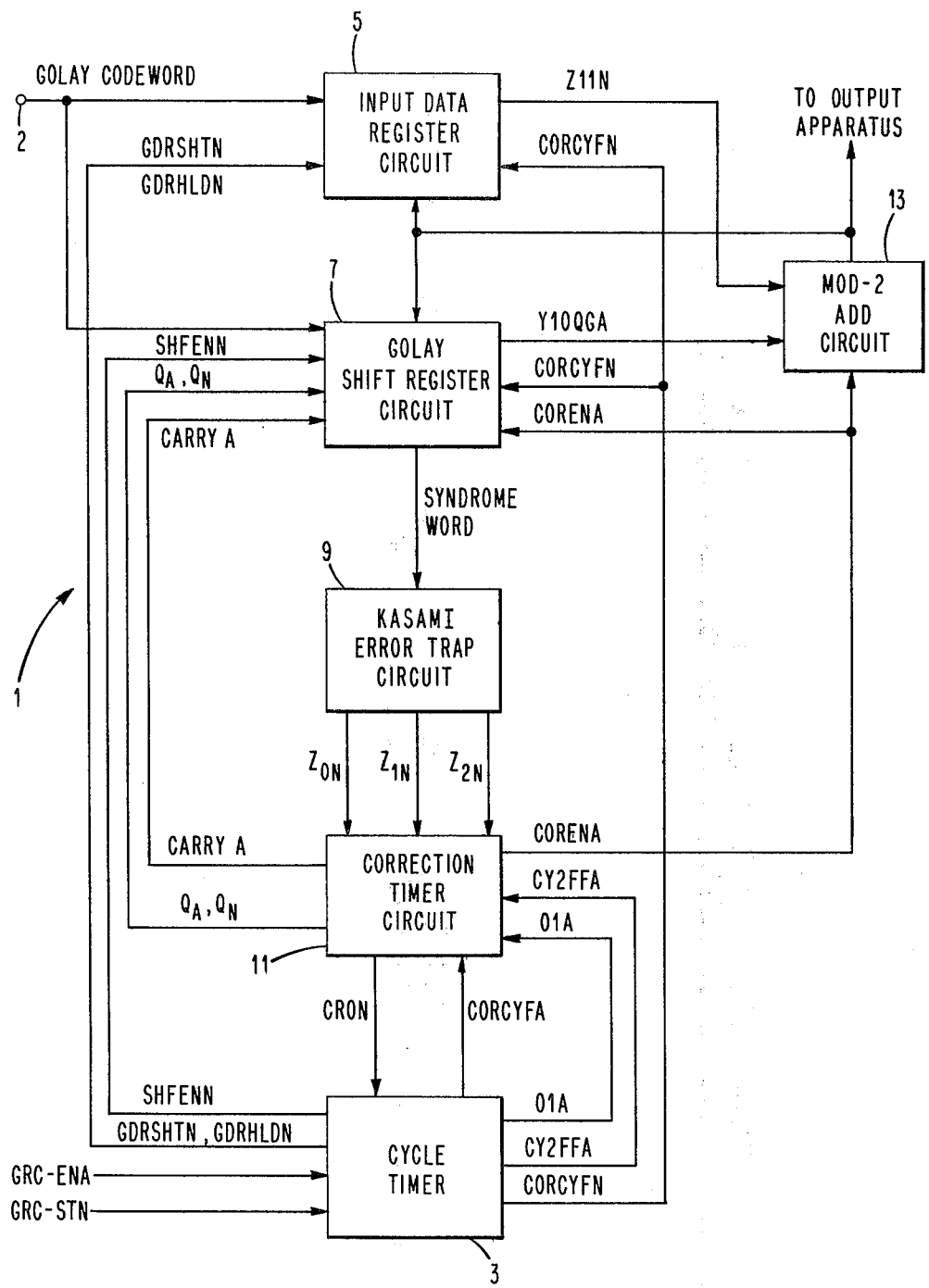
FIG. 1 is a block diagram of a forward error correcting apparatus in accordance with the present invention.
Figure 2:
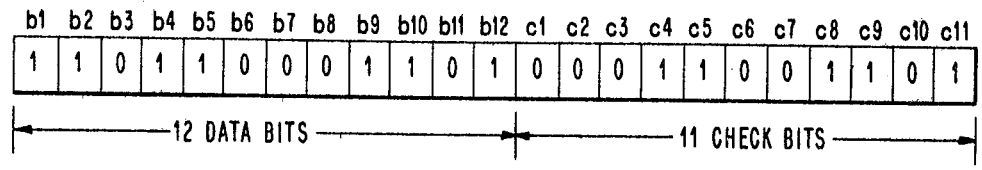
FIG. 2 is a schematic representation of a typical half-rate Golay codeword as may be examined by the forward error correcting apparatus in accordance with the invention.

Referring now to FIG. 1, there is shown a forward error correcting apparatus 1 in accordance with the present invention. The forward error correcting apparatus 1 is arranged to receive a half-rate Golay codeword at an input terminal 2 and to detect and correct up to a maximum of three errors in the codeword using the Kasami algorithm. The codeword as tested by the forward error correcting apparatus 1 has a general format as shown in FIG. 2 and includes twelve information or data bits b1-b12 and eleven check bits c1-c11 arranged in serial succession for a total bit length of 23 bits. By way of a specific example, for data bits b1-b12 having binary values of 110110001101, the corresponding check bits c1-c11 have binary values of 00011001101. The binary values of the check bits c1-c11 corresponding to the particular binary values of the data bits b1-b12 are determined by multiplying the bit values 110110001101, expressed in the polynomial form $x^{11}+x^{10}+x^8+x^7+x^3+x^2+1$, by $x^{n-k}$ ($x^{23-12}=x^{11}$), and then dividing the result by the generator polynomial $g(x)+x^{11}+x^{10}+x^6+x^5+x^4+x^2+1$ to derive the expression $x^7+x^6+x^3+x^2+1$ and the values 00011001101 for the check bits c1-c11.

The Golay codeword received at the input terminal 2 of the forward error correcting apparatus 1 is processed within the apparatus to determine the presence of errors (three maximum) in the codeword under the control of a cycle timer 3. The cycle timer 3 is shown in detail in FIG. 3 and is employed to establish the basic training for the apparatus 1 and also to control various time-related operations of the components of the apparatus 1. These components include, as indicated in FIG. 1, an input data register circuit 5, a Golay shift register circuit 7, a Kasami error trap circuit 9, a correction timer circuit 11, and a modulo-2 add circuit 13. The various signals employed and/or produced by these components are shown in FIG. 1 and correspond to those as shown in the other figures in which the components are illustrated in detail. It will be appreciated that, in the drawing and as employed in the following discussion, the signals designated with ending letters "A" are inversions of the like signals designated with ending letters "N". Standard logic components (gates, flip-flops, adders, half-adders, inverters, etc.) are shown in the figures and are so noted in the drawing.

The operation of the forward error correcting apparatus 1 to process a half-rate Golay codeword at the input terminal 2 is initiated by a signal GRC-ENA, shown in FIG. 9A, applied to the cycle timer 3. The cycle timer 3, as well as the other components of the apparatus 1, will have first been placed in a reset state by either a RESET A (high level) signal or a RESET N (low level) signal, as utilized alone or in conjunction with inverters or logic gates as indicated in the various figures of the drawing.

Figure 3:
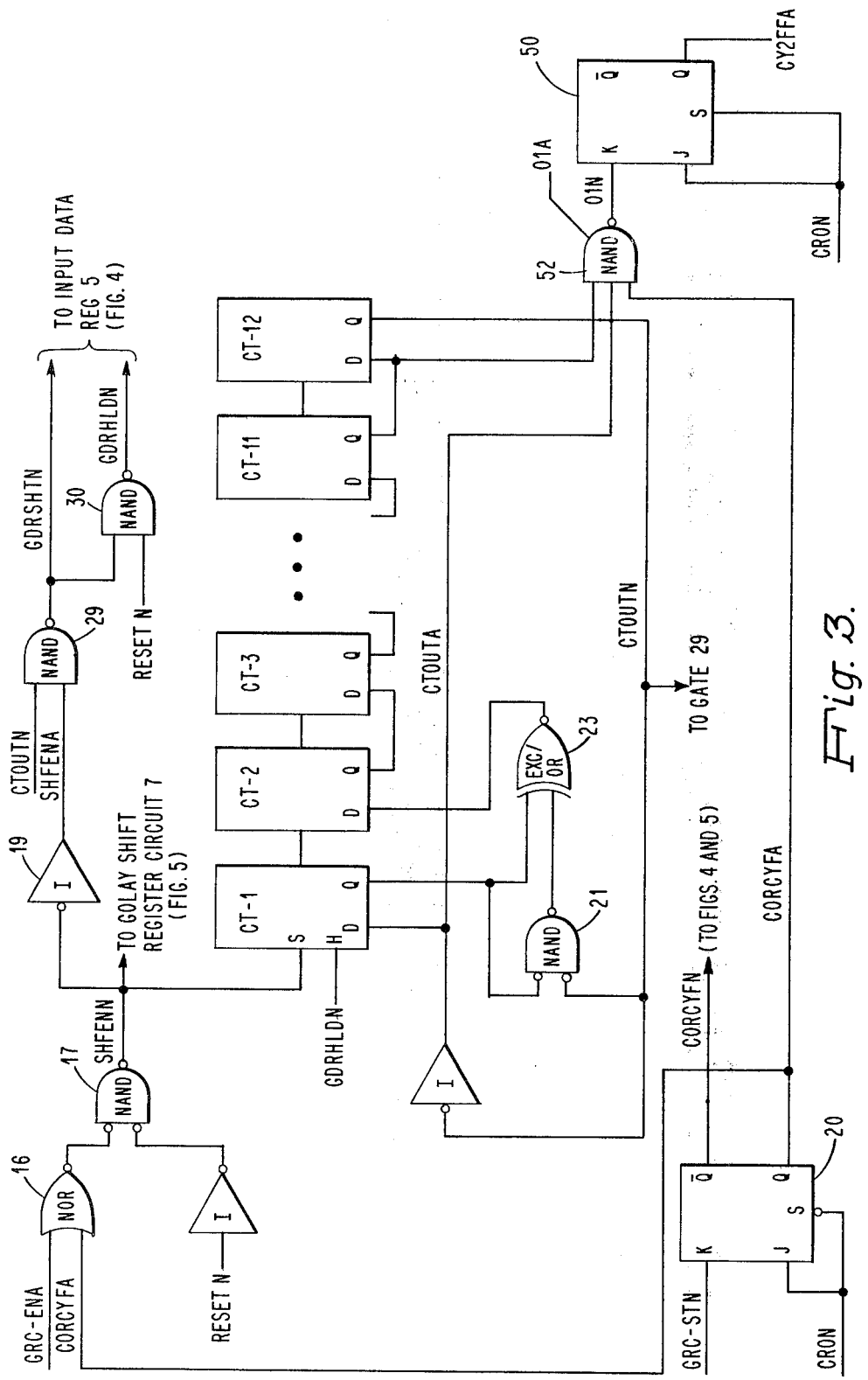
FIG. 3 is a schematic diagram of a cycle timer employed in the forward error correcting apparatus of FIG. 1.

As indicated in FIG. 3, the GRC-ENA signal applied to the cycle timer 3 acts, in conjunction with logic gates 16 and 17, an inverter 19, and a signal (low level) COR-CYFA derived from a J-K flip-flop 20, to produce a pair of signals SHFENN and SHFENA. The nature of the SHFENA, SHFENN and CORCYFA signals is shown in FIGS. 9B, 9C and 9D, respectively.

The signal SCHFENN is applied to a series of twelve shift register bit-storage stages CT-1 to CT-12, for example, of the sample-and-hold type, and enables these stages, in conjunction with a pair of gates 21 and 23, to operate at a predetermined frequency, for example, 68 Kilohertz, and function as a 23-bit clock ring for establishing successive 23-clock cycles for receiving and processing 23-bit Golay codewords received at the input terminal 2. The signal SCHFENN is also applied to the Golay shift register circuit 7, which is shown in detail in FIG. 5, and enables a series of eleven shift register bit-storage stages GS-1 to GS-11, for example, of the sample-and-hold type, to receive, store, and shift therealong in serial fashion and recirculate between its output and input the various bits (23) of the Golay codeword. To accomplish these operations within the stages GS-1 to GS-11, the codeword is applied to a gate 22 (FIG. 5) together with a high-level signal CORCYFN, as shown in FIG. 9E and produced by the aforementioned flip-flop 20 (FIG. 3), and transferred by way of a plurality of series-connected gates 24, 25, 26 and 27 to the data input (D) of the first stage GS-1 so as to be transferred in bit-by-bit succession along the stages GS-1 to GS-11. The recirculation of the bits of the codeword between the output and input of the series of stages GS-1 to GS-11, which only occurs in the presence of the signal CORCYFN (low level) at the gate 22, also takes place by way of the aforementioned gates 25, 26 and 27. It will be noted from FIGS. 9A and 9C that the twelve data bits of the codeword are gated into the Golay shift register circuit 7 during a twelve-bit period of each of the signals GRC-ENA and SHFENN and that the eleven check bits of the codeword are gated into the Golay shift register circuit 7 during a subsequent eleven-bit period of each of the signals GRC-ENA and SHFENN.

Figure 5:
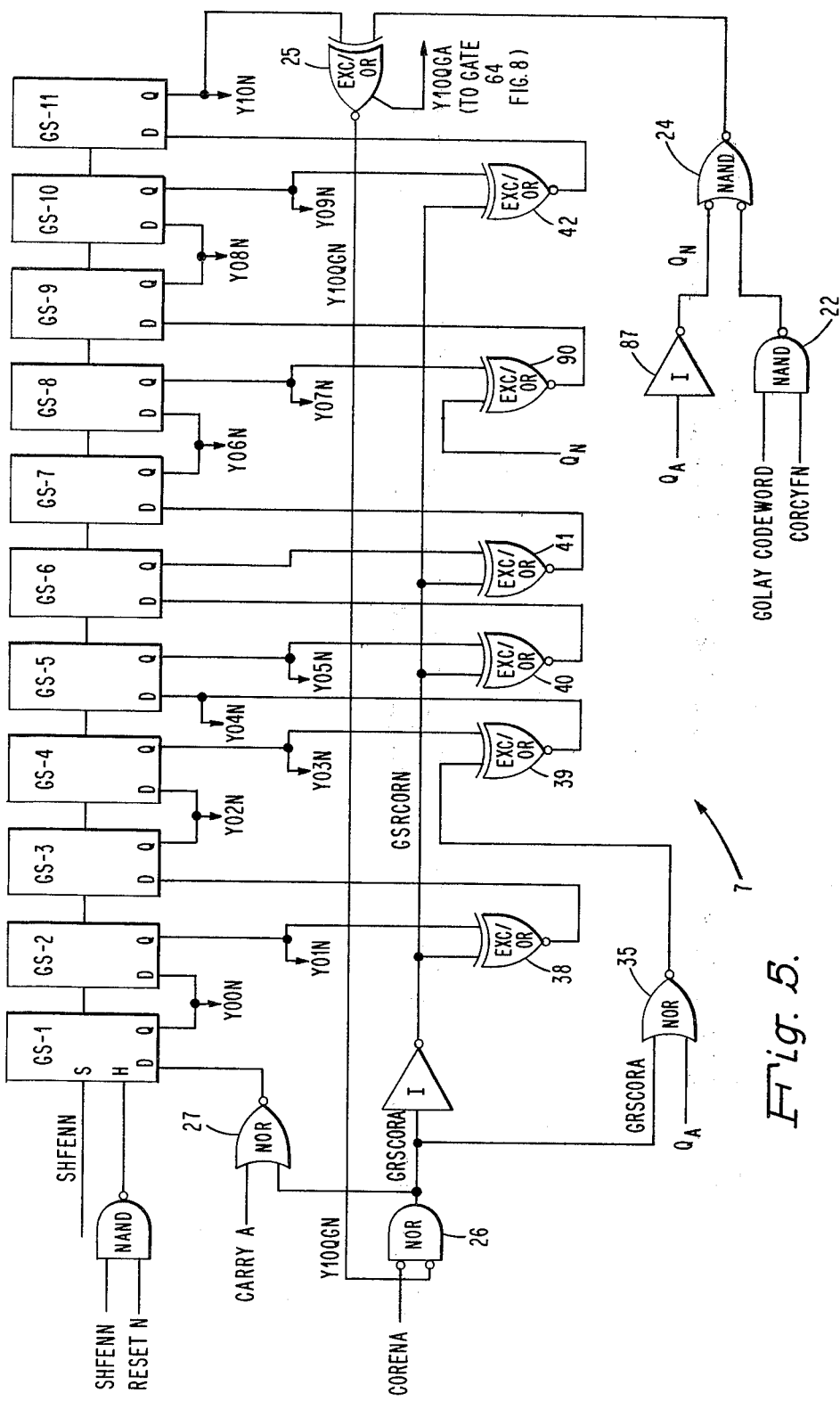
FIG. 5 is a schematic diagram of a Golay shift register circuit employed in the forward error correcting apparatus of FIG. 1.

The aforementioned SHFENA signal produced by the cycle timer 3 is applied to a gate 29 (FIG. 3) together with a low-level signal CTOUTN, as shown in FIG. 9F and derived from the stage CT-12 of the cycle timer 3, and causes signals GDRSHTN and GDRHLDN to be produced and applied to the input data register circuit 5 which is shown in detail in FIG. 4. The GDRSHTN signal, which is shown in FIG. 9G, serves to enable a series of twelve bit-storage stages DR-1 to DR-12, for example, of the sample-and-hold type, to receive, store, and shift therealong in serial fashion and, at appropriate times, to recirculate between its output and input the twelve data bits of the Golay codeword. The GSRHLDN signal is provided by way of a gate 30 (FIG. 3) and is utilized to hold data in the register stages DR-1 to DR-12 between shifting operations. (Similar signals are also employed by the stages CT-1 to CT-12 of the cycle timer 3 and the stages GS-1 to GS-11 of the Golay shift register circuit 7, as indicated in FIGS. 3 and 5, respectively.) To accomplish the aforementioned data receiving, storing and shifting operations within the stages DR-1 to DR-12, the codeword is applied to a gate 31 (FIG. 4), together with an inversion of the aforementioned CORCYFN signal (FIG. 9E) as derived by an inverter 32. The codeword is gated through the gate 31 and also a gate 33 into the data input (D) of the first stage DR-1 so that the bits of the codeword are transferred in bit-by-bit succession along the stages GS-1 to GS-11. The recirculation of the data bits of the codeword between the output and input of the series of stages DR-1 to DR-12, which only occurs in the presence of the signals CORCYFN and GDRSHTN (at their low levels), takes place by coupling the output Z11N (FIG. 4) of the last stage DR-12 of the data shift register circuit 5 through components of the modulo-2 add circuit 3 of FIG. 8 including, as shown in FIG. 8, a gate 34 and an associated inverter 36, and then through a gate 37 (FIG. 4) and the aforementioned gate 33 to the data input (D) of the first stage DR-1 of the input data register circuit 5. It will be noted from FIGS. 9A and 9G that the twelve data bits of the Golay codeword are gated into the input data register circuit 5 during a twelve-bit period of each of the signals GRC-ENA and GDRSHTN.

Once the bits of the Golay codeword have been shifted into and along the input data register circuit 5 and the Golay shift register circuit 7 as discussed hereinabove, it then becomes necessary to examine the codeword to determine if any erroneous bits exist which are capable of being "trapped" by the Kasami algorithm and, if so, to correct the erroneous bits (up to a maximum of three). The above operation is initiated by a start pulse signal GRC-STN as shown in FIG. 9H. This signal, which is one bit-period wide, occurs immediately following the 11-bit check period and is applied to the cycle timer 3, specifically, to the aforementioned flip-flop 20 (FIG. 3). The flip-flop 20 operates in response to the start pulse signal GRC-STN to switch its output CORCYFA from its low level to a high level thereby to establish a 46-clock or bit period within which the bits of the codeword shifted into and along the Golay shift register circuit 7 are examined in accordance with the Kasami algorithm to detect errors (up to a maximum of three) and, if errors are detected, to correct them. Until such time as the Kasami algorithm detects one of the three possible error patterns, the presence of the signal GDRSHTN (low level) allows the data bits in the input data register circuit 5 to recirculate within the circuit 5 and, similarly, the presence of the low-level signal CORCYFN allows the codeword bits shifted into and along the Golay shift register circuit 7 to recirculate within the circuit 7.

As the Golay codeword bits are shifted along and recirculated within the Golay shift register circuit 7 as described hereinabove, the Golay codeword bits are divided by the aforementioned polynomial generator $g(x)$ for the purpose of obtaining an 11-bit syndrome word to be tested by the Kasami algorithm. This division operation is performed automatically as the bits shift through the Golay shift register circuit 7 by means of a signal GSRCORA as derived from the aforementioned gate 26 and coupled through a gate 35, and also by means of several gates 38–42 connected to selected ones of the data inputs (D) and outputs (Q) of the stages GS-1 to GS-11 in the particular manner as shown in FIG. 5. The division operation results in the 11-bit syndrome word which is examined on a continuing basis by the aforementioned Kasami error trap circuit 9. This syndrome word is represented by signals Y00N to Y10N as produced by specific ones of the stages GS-1 to GS-11 of the Golay shift register circuit 7 as indicated in FIG. 5.

The Kasami error trap circuit 9 examines, in accordance with the Kasami algorithm, the bits of the syndrome word produced continuously by the Golay shift register circuit 7 to detect one of three different error patterns, designated $Z_0$, $Z_1$ and $Z_2$, and represented mathematically by $$Z_0 = 1 \text{ if and only if } \sum_{iN=0}^{10} Y_{0i} \leq 3; Z_1 = 1 \text{ if and only if } Y_{00N} +$$

$$\overline{Y_{01N}} + \overline{Y_{02N}} + Y_{03N} + Y_{04N} + \overline{Y_{05N}} + \overline{Y_{06N}} + Y_{07N} +$$

$$\overline{Y_{08N}} + \overline{Y_{09N}} + Y_{10N} \leq 2; \text{ and } Z_2 = 1 \text{ if and only if } Y_{0N} +$$

$$Y_{01N} + \overline{Y_{02N}} + \overline{Y_{03N}} + Y_{04N} + Y_{05N} + \overline{Y_{06N}} + \overline{Y_{07N}} +$$

$$Y_{08N} + \overline{Y_{09N}} + \overline{Y_{10N}} \leq 2$$

Figure 10A:
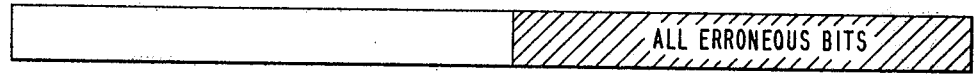
FIGS. 10A-10C are schematic representations of Golay code error trapping tests as performed by the Kasami error trap circuit of FIG 6.
Figure 10B:
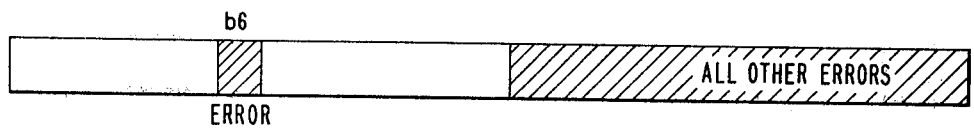
Figure 10C:
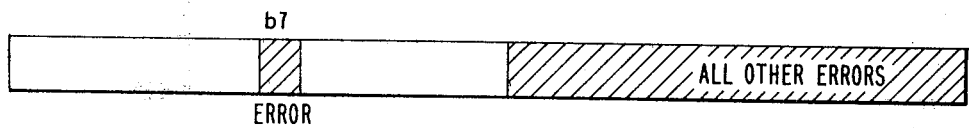

The elements of the above expressions having bars thereabove represent binary 1's and the elements having no bars thereabove represent binary 0's. Thus, $Z_0$ is true (that is, has a binary value of 1) if the syndrome word tested contains three or fewer 1's. This situation is illustrated in FIG. 10A and indicates that all errors are in the check bit portion (bits c1-c11) of the associated codeword. $Z_1$ is true when the syndrome word tested differs from the above expression for $Z_1$ by two or fewer elements of the expression for $Z_1$. The situation in which $Z_1$ is true is illustrated in FIG. 10B and indicates an error in bit position 6 of the data portion (bits b1-b12) of the associated codeword with all other errors, if any (but not more than 2), being in the check bit portion of the codeword. $Z_2$ is true when the syndrome word tested differs from the above expression for $Z_2$ by two of fewer elements of the expression for $Z_2$. The situation in which $Z_2$ is true is illustrated in FIG. 10C and indicates an error in bit position 7 of the data portion of the associated codeword with all other errors, if any (but not more than 2), again being in the check bit portion of the codeword. A binary value of 0 for any of the above expressions for $Z_0$-$Z_2$, that is, the syndrome word is 0, indicates that no errors are present in the associated codeword.

Figure 6:
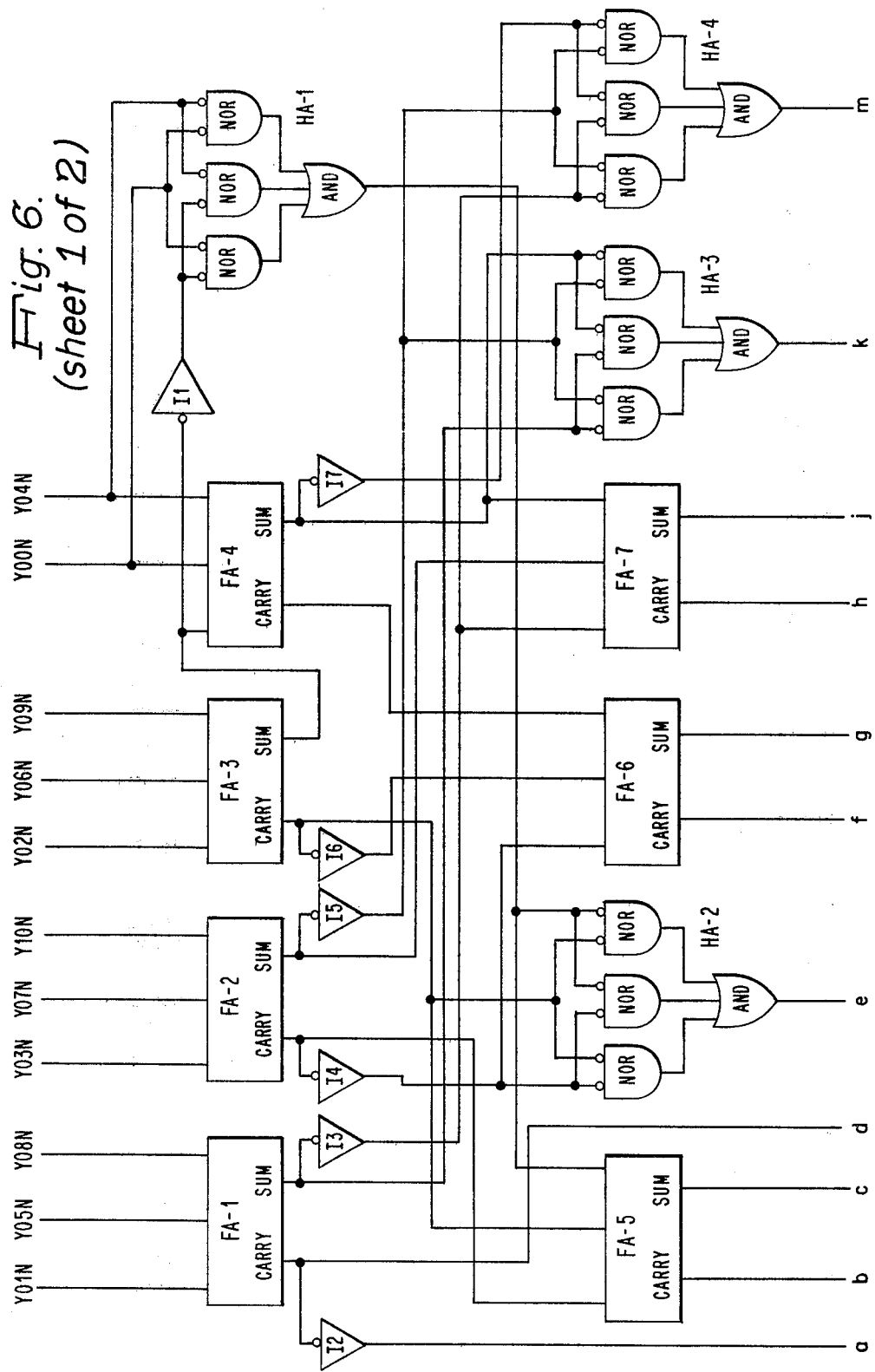
FIG. 6 is a schematic diagram of a Kasami error trap circuit employed in the forward error correcting apparatus of FIG. 1.

The specific apparatus employed by the Kasami error trap circuit 9 in testing the syndrome word for one of the three possible error patterns is shown in detail in FIG. 6. As indicated in FIG. 6, the Kasami error trap circuit 9 comprises a plurality of standard full adder circuits FA-1 to FA-9, a plurality of standard half adder circuits HA-1 to HA-5, a plurality of inverters $I_1$-$I_{11}$, and a plurality of output logic gates 43-49. The above components are interconnected with each other in the specific fashion as shown in FIg. 6 so as to effectively perform simultaneous operations for solving for $Z_0$-$Z_2$ as defined hereinabove. The above components are thus shared, resulting in a smaller component count than would otherwise be the case if $Z_0$-$Z_2$ were to be solved independently of each other using individual sets of components.

When the abovedescribed Kasami error trap circuit 9 has detected an error pattern represented by either $Z_0$ or $Z_1$, an error signal pulse $Z_{0N}$ or $Z_{1N}$ *as shown in FIG. 9I is produced at the output of the gate* 43 *or the gate* 44 *(FIG. 6), respectively, of the Kasami error trap circuit* 9, *and, similarly, when an error pattern represented by* $Z_2$ *is detected, an error signal pulse* $Z_{2N}$ *as* shown in FIG. 9J is produced at the output of the gate 45 of the error trap circuit 9. As indicated in FIGS. 9I and 9J, the pulses $Z_{0N}$-$Z_{2N}$ may occur at any time within the shaded box portions of FIGS. 9I and 9J.

Each of the pulses $Z_{0N}$-$Z_{2N}$, when produced by the Kasami error trap circuit 9 as discussed hereinabove, is applied to the aforementioned correction timer circuit 11 so that correction of the erroneous bits of the codeword can be effected within the remaining time of the aforementioned signal CORCYFA. The second half of the signal CORCYFA, during which correction takes place, is marked by a signal CY2FFA as indicated in FIG. 9K and produced by a J-K flip-flop 50 (FIG. 3) included in the aforedescribed cycle timer 3. The flip-flop 50 is set to produce the signal CY2FFA as a result of a gate 52 connected with the flip-flop 50 having all of its inputs at a high level.

Figure 7:
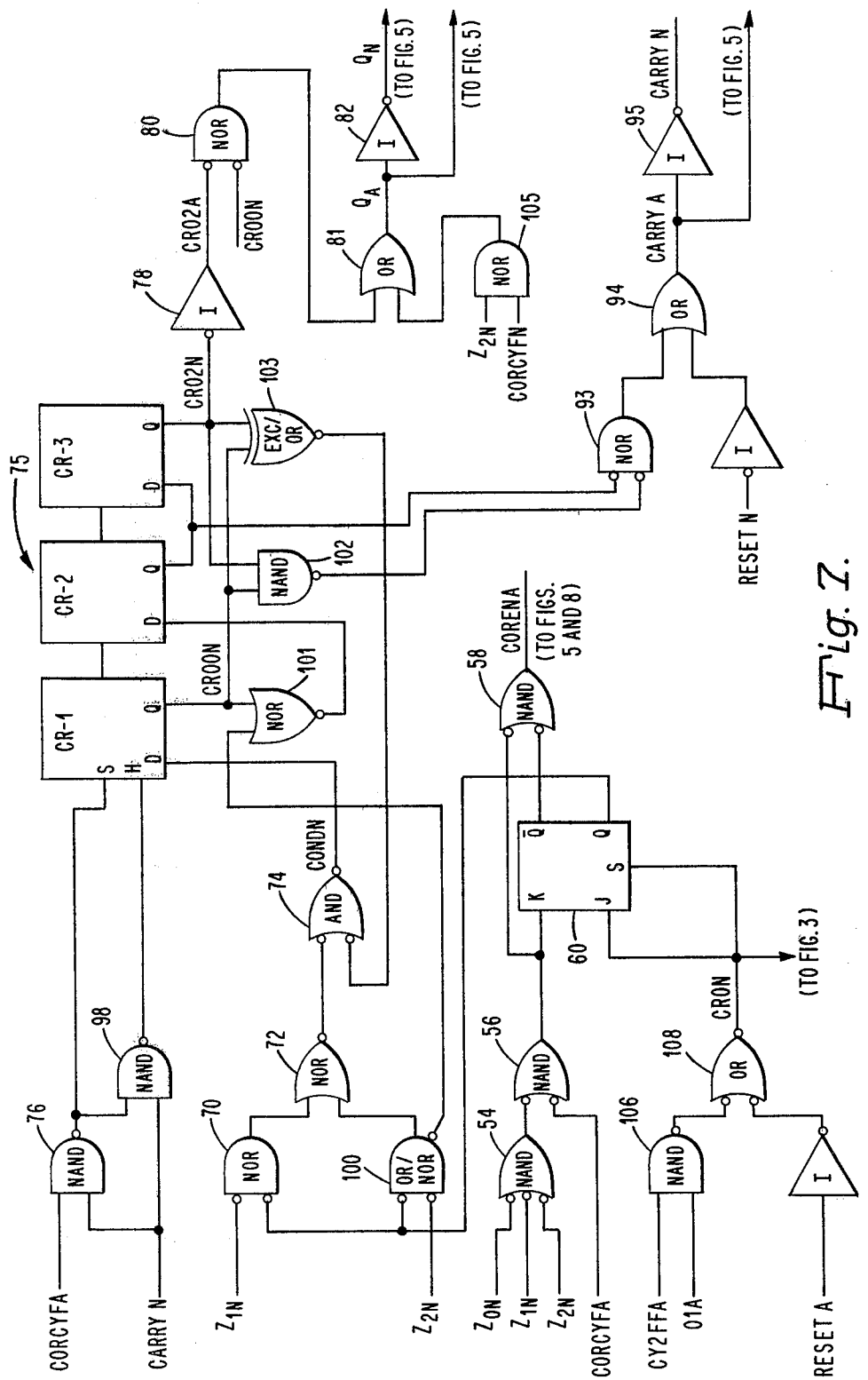
FIG. 7 is a schematic diagram of a correction timer circuit employed in the forward error correcting apparatus of FIG. 1.

If the Kasami error trap circuit 9 produces any one of the pulses $Z_{0N}$-$Z_{2N}$, this pulse is applied for purposes of correcting the erroneous codeword to a gate 54 within the correction timer circuit 11 (FIG. 7). As a result, a signal CORENA is produced by way of a gate 56 to which the signal CORCYFA is applied, a gate 58, and a J-K flip-flop 60. The production of the CORENA signal, which is shown in FIG. 9L and which may go high at any time within the shaded box in FIG. 9L, indicates that errors have been found in the codeword tested and correction of the erroneous codeword is to be performed. The CORENA signal is applied to the aforedescribed gate 26 (FIG. 5) of the Golay shift register circuit 7 and, by disabling a signal Y10QGN from the output of the gate 25, serves to discontinue the recirculation of the contents of the circuit 7 so that the necessary correction can be made in the codeword. The CORENA signal is also applied to the modulo-2 add circuit 13 as indicated in FIG. 8 for purposes to be explained hereinbelow.

If the CORENA signal was produced as a result of a $Z_{0N}$ pulse, the corrective action to be taken is to add serially, in a modulo-2 addition, the contents of the Golay shift register circuit 7 and the input data register circuit 5 and to then get the codeword in proper position within the circuits 5 and 7. These operations are initiated by shifting the contents of both the Golay shift register circuit 7 and the input data register circuit 5 by exactly 11 shifts or clocks and adding the contents together as the shifting takes place in the modulo-2 add circuit 13 as enabled by the CORENA signal. The contents of the Golay shift register circuit 7, appearing at an output Y10QGA (FIG. 5) of the gate 25, are applied to a gate 64 of the modulo-2 add circuit 13 (FIG. 8), and added together by way of the aforementioned gate 34 with the contents of the input data register circuit 5 as appearing at the aforementioned output $Z_{11N}$ (FIG. 4). The output of the modulo-2 add circuit 13 following the modulo-2 addition performed thereby is applied back to the input data register circuit 5, specifically, by way of the aforementioned gates 37 and 33 (FIG. 4) of the input data register circuit 5. The input data register circuit 5 and the Golay shift register circuit 7 are then clocked, one bit at a time, by the aforementioned signals GDRSHTN and SHFENN, until the aforementioned signal CORCYFA, FIG. 9D, has terminated, that is, goes low. As such time as the signal CORCYFA goes low, the codeword, now corrected, has been shifted into the proper position, specifically, the original position in the input data register circuit 5 and the Golay shift register circuit 7. As a new codeword is shifted into the circuits 5 and 7, the old codeword, which appears at the output of the mod-2 add circuit 13, is applied to any suitable output apparatus (not shown) for appropriate use thereby.

If the aforementioned CORENA signal was produced as a result of a $Z_{1N}$ pulse, the CORENA signal is employed as before but additional operations are required. As indicated in FIG. 7, the $Z_{1N}$ pulse, in addition to being applied to the aforementiond gate 54 to generate the CORENA signal, is also applied to a gate 70. The $Z_{1N}$ pulse is coupled by way of the gate 70 and by way of gates 72 and 74 to an input (D) of the first one of a series of counter stages CR-1 to CR-3. The stages CR-1 to CR-3, which may be of the sample-and-hold type, are arranged as a three-stage counter 75. The counter 75 is enabled by means of the signal CORCYFA (FIG. 9) and a gate 76 to which the signal CORCYFA is applied. The pulse $Z_{1N}$ causes the counter 75 to be set to a count of 2. The contents of the input data register circuit 5 and the Golay shift register circuit 7 are then added (modulo-2) within the modulo-2 add circuit 13 in the same manner as previously described. The counter 75 is incremented (by the basic system clock), and when the counts in the counter reaches values 3 and 4, these counts are detected by components including an inverter 78, gates 80 and 81, and an inverter 82. A signal $Q_A$ is produced at the output of the gate 81 and inverted to a signal $Q_N$ at the output of the inverter 82. The output $Q_A$, which is shown in FIg. 9M, is applied to the aforementioned gate 35 (FIG. 5) in the Golay shift register circuit 7 and also to the aforementioned gate 24 (FIG. 5) after being inverted by an inverter 87. The signal $Q_N$ is applied to a gate 90 (FIG. 5) in the Golay shift register circuit 7. The application of the signals $Q_A$ and $Q_N$ to the abovementioned gates serves to add a binary 1 to stages 4, 8 and 11 of the Golay shift register circuit 7. The counter 75 in the correction timer circuit 11 continues to be incremented and, when the count therein reaches a value of 8, this count is detected by components including gates 93 and 94 (FIG. 7) thereby to produce a signal CARRY A which is then inverted to a signal CARRY N by an inverter 95. The CARRY A signal, which is shown in FIG. 9N, is applied to the aforementioned gate 27 (FIG. 5) of the Golay shift register circuit 7 and causes a binary 1 to be shifted into bit position 1 that is, stage GS-1, of the Golay shift register circuit 7. The CARRY N signal is applied to a gate 98 (FIG. 7) in the correction timer circuit 11 and serves to stop the counter 75 by placing all 0's in the stages CR-1 to CR-3 of the counter 75. As the above operations relative to the counter 75 take place, the modulo-2 addition continues and the data in the input data register circuit 5 and the Golay shift register circuit 7 continue to be shifted, one bit at a time, until the signal CORCYFA goes low. At this time, the codeword is in its proper position in the input data register circuit 5 and the Golay shift rgister circuit 7.

In the event the CORENA signal as discussed hereinabove was produced as a result of a $Z_{2N}$ pulse, the operation of the correction timer circuit 11 in response to the $Z_{2N}$ pulse is similar to that with respect to the $Z_{1N}$ pulse except that the counter 75 is set to a count of 3 upon the occurrence of the $Z_{2N}$ pulse rather than to a count of 2. In this case, the pulse $Z_{2N}$, FIG. 9J, is applied to a gate 100 (FIG. 7) and causes the counter 75 to be set to a count of 3 by way of gates 101, 102 and 103. The pulse $Z_{2N}$ is also applied to a gate 105 together with the signal CORCYFN, for producing $Q_A$ and $Q_N$ signals. The remaining operations, including the generation of the signals CARRY A, CARRY N, etc., are the same as previously described in connection with the $Z_{1N}$ operations, and at the termination of the signal CORCYFA the codeword is in its proper position in the data register circuit 5 and the Golay shift register circuit 7.

The CORENA signal as discussed hereinabove is terminated when the signal CY2FFA, FIG. 9K, goes low concurrently with the end of the 46-clock or bit cycle during which detection and correction of an erroneous codeword took place. This latter event is indicated by a signal 01A as shown in FIg. 9O and produced by the aforementioned gate 52 (FIG. 3) in the cycle timer 3 during the last bit period of the abovementioned 46-bit cycle. The signal 01A, together with the signal CY2FFA, is applied to a gate 106 in the correction timer circuit 11 (FIG. 7) and causes a signal CRON to be produced by way of a gate 108 and applied to the flip-flop 60 for resetting the flip-flop 60 and terminating the signal CORENA at the output of the gate 58. The CRON signal is also applied to the aforementioned flip-flops 20 and 50 (FIG. 3) in the cycle timer 3 for resetting these flip-flops and terminating the signals CORCYFA and CY2FFA.

While there has been described what is considered to be a preferred embodiment of the invention, it will be apparent to those skilled in the art that various changes and modifications may be made therein without departing from the invention as called for in the appended claims.

What is claimed is:

1. A forward error correcting apparatus for detecting and correcting errors in a half-rate Golay codeword, said codeword comprising a plurality of data bits and a plurality of check bits arranged in serial succession, said forward error correcting apparatus comprising:

input data register circuit means for receiving in succession and storing therewithin the data bits of the Golay codeword;

Golay register circuit means for receiving in succession, storing, and recirculating therewithin the data and check bits of the Golay codeword;

timer means coupled to the input data register circuit means and to the Golay register circuit means and operative to cause the data bits received by the input data register circuit means to be shifted therewithin and the data and check bits received by the Golay register circuit means to be shifted and recirculated therewithin, said timer means being further operative following the receipt, storage, and shifting within the input data register circuit means and the Golay register circuit means of the bits of the Golay codeword to produce an error detection and correction signal of a predetermined time period during which detection and correction of an erroneous Golay codeword is to take place;

said Golay register circuit means including divider means operative as the bits of the Golay codeword are shifted and recirculated within the Golay register circuit means to divide the codeword by a predetermined generator polynomial thereby to derive a recirculating syndrome word comprising a plurality of bits;

Kasami error trap circuit means coupled to the Golay register circuit means and operative during recirculation of the syndrome word in the Golay register circuit means and during the time period of the error detection and correction signal produced by the timer means to examine the syndrome word to detect one of three possible Kasami algorithm error patterns representing the existence of errors in the associated codeword, and operative in response to detecting any one of the error patterns to produce a corresponding error signal;

modulo-2 add means coupled to the input data register circuit means and to the Golay register circuit means and arranged for performing modulo-2 addition operations on the contents of the input data register circuit means and the Golay register circuit means; and correction timer means coupled to the Kasami error trap circuit means and to the modulo-2 add means and arranged to receive an error signal produced by the Kasami error trap means, said correction timer means being operative if the error signal corresponds to a first one of the Kasami algorithm error patterns to cause the modulo-2 add means to modulo-2 add the contents of the input data register circuit means and the Golay register circuit means and to apply the result to the input data register circuit means, and said correction timer means being operative if the aforesaid error signal corresponds to a second or third one of the Kasami algorithm error patterns to alter the contents of the Golay register circuit means at a first or second time, respectively, and to cause the modulo-2 add means to modulo-2 add the contents of the input data register circuit means and the altered contents of the Golay register circuit means and to apply the result to the input data register circuit means; and said timer means being operative after any one of the aforesaid modulo-2 addition operations to cause the codeword bits in the input data register circuit means and the Golay register circuit means to be shifted until the termination of the error detection and correction signal produced by the timer means.

2. A forward error correcting apparatus in accordance with claim 1 wherein:

the divider means of the Golay register circuit means is operative to divide the Golay codeword shifted and recirculated within the Golay shift register circuit means by a generator polynomial g(x) circuit means by a generator polynomial g(x) represented by $x^{11}+x^{10}+x^6+x^5+x^4+x^2+1$.

3. A forward error correcting apparatus in accordance with claim 1 wherein:

the input data register means includes a plurality of bit-storage stages for receiving, storing and shifting therealong the data bits of the Golay codeword, said stages being equal in number to the number of data bits in the Golay codeword;

the Golay register circuit means includes a plurality of bit-storage stages for receiving, storing, shifting and recirculating therewithin the data and check bits of the Golay codeword, said stages being equal in number to the number of check bits in the Golay codeword; and the timer means is operative following the receipt and shifting of the bits of the Golay codeword along the stages of the input data register means and the golay register circuit means to produce an error detection and correction signal of a time period related to the combined durations of the data and check bits of the Golay codeword.

4. A forward error correcting apparatus in accordance with claim 3 wherein:

the Golay codeword comprises twelve data bits and eleven check bits of like duration; and the error detection and correction signal produced by the timer means has a forty-six bit duration.

5. A forward error correcting apparatus in accordance with claim 4 wherein:

the timer means includes means operative following the receipt and shifting of the bits of the Golay codeword along the bit-storage stages of the input data register means and the Golay register circuit means to receive a start signal and, in response thereto, to produce the error detection and correction signal.

6. A forward error correcting apparatus in accordance with claim 1 wherein:

the Golay register circuit means includes a plurality of bit-storage stages for receiving, storing, shifting, and recirculating therein the data and check bits of the Golay codeword; and the divider means of the Golay register circuit means comprises a plurality of gates connected to selected ones of the aforesaid bit-storage stages and operative as the data and check bits of the Golay codeword are shifted along and recirculated within the bit-storage stages to divide the codeword by a predetermined generator polynomial thereby to derive a syndrome word comprising a plurality of bits.

7. A forward error correcting apparatus in accordance with claim 6 wherein:

the plurality of gates of the divider means of the Golay register circuit means are operative to divide the Golay codeword shifted and recirculated within the Golay shift register circuit by a generator polynomial g(x) represented by $x^{11}+x^{10}+x^6+x^5+x^4+x^2+1$.

8. A forward error correcting apparatus in accordance with claim 2 wherein:

the Kasami error trap circuit means includes a plurality of full adder circuit means and half adder circuit means interconnected together and arranged to examine the syndrome word produced by the Golay register circuit means and to produce an error signal when any one of the three possible Kasami algorithm error patterns is detected in the syndrome word.

9. A forward error correcting apparatus in accordance with claim 1 wherein:

the Golay codeword comprises twelve data bits and eleven check bits of like duration;

the input data register means includes twelve bit-storage stages for receiving, storing and shifting therealong the twelve data bits of the Golay codeword;

the Golay register circuit means includes eleven bit-storage stages for receiving, storing, shifting, and recirculating therein the twelve data bits and eleven check bits of the Golay codeword;

the divider means of the Golay register circuit means is operative to divide the Golay codeword shifted and recirculated within the bit-storage stages of the Golay register circuit means by a generator polynomial g(x) represented by $x^{11}+x^{10}+x^6+x^5+x^4+x^2+1$ thereby to derive a syndrome word comprising eleven bits;

the timer means is operative following the receipt and shifting of the bits of the Golay codeword within the bit-storage stages of the input data register means and the Golay register circuit means to produce an error detection and correction signal of a forty-six bit duration;

the first one of the Kasami algorithm error patterns examined by the Kasami error trap circuit means indicates the presence of three or fewer erroneous bits in the check bit portion of the Golay codeword, the second one of the Kasami algorithm error patterns examined by the Kasami error trap circuit means indicates the presence of two or fewer erroneous bits in the check bit portion of the Golay codeword and one erroneous bit in a first specific data bit position of the Golay codeword, and the third one of the Kasami algorithm error patterns examined by the Kasami error trap circuit means indicates the presence of two or fewer erroneous bits in the check bit portion of the Golay codeword and one erroneous bit in a second specific data bit position of the Golay codeword following the aforesaid first specific data bit position; and the correction timer means includes:

counter means arranged to count through successive count values;

first means coupled to the counter means and arranged to receive from the Kasami error trap means an error signal corresponding to the second one of the Kasami algorithm error patterns and operative in response thereto to set the counter means to a predetermined first count value;

second means coupled to the counter means and arranged to receive from the Kasami error trap circuit means an error signal corresponding to the third one of the Kasami algorithm error patterns and operative in response thereto to set the counter means to a predetermined second count value;

third means operative to clock the counter means through successive count values from the first and second count values;

fourth means coupled to the counter means and to the Golay register circuit means and operative when the counter means has been clocked to specific third, fourth, and fifth count values to detect such count values and to alter the contents of specific ones of the bit-storage stages of the Golay register circuit means and, after detecting the fifth count value, to terminate the counting of the counter means; and fifth means coupled to the modulo-2 add means and arranged to receive an error signal corresponding to either the first, second or third one of the Kasami algorithm error patterns and operative in response to the error signal to cause the modulo-2 add means to modulo-2 add the contents of the bit-storage stages of the input data register circuit means and the then existing contents of the bit-storage stages of the Golay register circuit means and to apply the result to the bit-storage stages of the input data register circuit means.

10. A forward error correcting apparatus in accordance with claim 9 wherein:

the timer means includes means operative following the receipt and shifting of the bits of the Golay codeword within the bit-storage stages of the input data register means and the Golay register circuit means to receive a start signal and, in response thereto, to produce the error detection and correction signal.

11. A forward error correcting apparatus in accordance with claim 10 wherein:

the divider means of the Golay register circuit means comprises a plurality of gates connected to selected ones of the bit-storage stages of the Golay register circuit means and operative as the data and check bits of the Golay codeword are shifted and recirculated within the bit-storage stages to divide the codeword by the generator polynomial g(x) thereby to produce the syndrome word.

12. A forward error correcting apparatus in accordance with claim 11 wherein:

the Kasami error trap circuit means includes a plurality of full adder circuit means and half adder circuit means interconnected together and arranged to examine the syndrome word produced by the gates of the divider means of the Golay register circuit means and to produce an error signal when any one of the three possible Kasami algorithm error patterns is detected in the syndrome word.

13. A forward error correcting apparatus in accordance with claim 11 wherein:

the first means of the correction timer means is operative in response to an error signal corresponding to the second one of the Kasami algorithm error patterns to set the counter means to a count value of 2;

the second means of the correction timer means is operative in response to an error signal corresponding to the third one of the Kasami algorithm error patterns to set the counter means to a count value of 3; and the fourth means is operative when the counter means has been clocked by the third means to count values of 3 and 4 to detect such count values and to alter the logic values of bits in the 4th, 8th and 11th bit-storage stages of the Golay register circuit means, and further operative when the counter means has been clocked by the third means to a count value of eight to detect such count value and to alter the logic value of the bit in the first bit-storage stage of the Golay register circuit means and to terminate the counting of the counter means.

* * * * *